(12) United States Patent
Wu et al.

(10) Patent No.: US 11,259,423 B2
(45) Date of Patent: Feb. 22, 2022

(54) MULTILAYER HOUSINGS

(71) Applicant: HEWLETT-PACKARD DEVELOPMENT COMPANY, L.P., Houston, TX (US)

(72) Inventors: Kuan-Ting Wu, Taipei (TW); Kevin Voss, Houston, TX (US); Ai-Tsung Li, Taipei (TW); Wei Kuang Chu, Taipei (TW); Wei-Chung Chen, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 824 days.

(21) Appl. No.: 16/074,175

(22) PCT Filed: Oct. 3, 2016

(86) PCT No.: PCT/US2016/055130
§ 371 (c)(1),
(2) Date: Jul. 31, 2018

(87) PCT Pub. No.: WO2018/067104
PCT Pub. Date: Apr. 12, 2018

(65) Prior Publication Data
US 2021/0136938 A1    May 6, 2021

(51) Int. Cl.
*B32B 3/00* (2006.01)
*H05K 5/02* (2006.01)
(Continued)

(52) U.S. Cl.
CPC ............. *H05K 5/02* (2013.01); *B32B 3/26* (2013.01); *B32B 7/14* (2013.01); *G06F 1/1656* (2013.01);
(Continued)

(58) Field of Classification Search
CPC .. H05K 5/00; H05K 5/02; H05K 5/03; H05K 5/04; H05K 5/0086; H05K 7/1427
See application file for complete search history.

(56) References Cited

U.S. PATENT DOCUMENTS

| 5,422,175 | A | 6/1995 | Ito et al. |
| 6,521,830 | B1 | 2/2003 | Platz |
| 8,830,665 | B2 * | 9/2014 | Lynch ............ B32B 15/18 361/679.02 |

(Continued)

FOREIGN PATENT DOCUMENTS

| CN | 203689249 U | 7/2014 |
| CN | 105098049 A | 11/2015 |

(Continued)

OTHER PUBLICATIONS

Li et al., "Graphene Heat Dissipation Film for Thermal Management of Hot Spot in Electronic Device", Journal of Materials Science: Materials in Electronics, vol. 27, Issue 7, Abstract, Retrieved from Internet: https://link.springer.com/article/10.1007/s10854-016-4758-0, 2016, 3 pages.

*Primary Examiner* — Elizabeth E Mulvaney
(74) *Attorney, Agent, or Firm* — Brooks, Cameron & Huebsch PLLC (57) ABSTRACT

Example implementations relate to multilayer housings. In one example, multilayer housing can include a first continuous layer comprising copper, plastic, graphene, aluminum, titanium, magnesium, or combinations thereof, a void layer on the first continuous layer, wherein the void layer comprises from (5) volume percent (vol. %) to (95) vol. % voids; and a second continuous layer on the void layer, wherein the second continuous layer comprises copper, plastic, graphene, aluminum, titanium, magnesium, or combinations thereof.

15 Claims, 8 Drawing Sheets

(51) Int. Cl.
   *B32B 3/26* (2006.01)
   *B32B 7/14* (2006.01)
   *G06F 1/16* (2006.01)
   *H05K 5/00* (2006.01)

(52) U.S. Cl.
   CPC ........ *H05K 5/0086* (2013.01); *B32B 2255/20* (2013.01); *B32B 2457/00* (2013.01)

(56) References Cited

U.S. PATENT DOCUMENTS

| | | | |
|---|---|---|---|
| 9,384,875 | B2 | 7/2016 | Kimura et al. |
| 2012/0250250 | A1* | 10/2012 | Tatebe .................. G06F 1/1656 361/679.55 |
| 2013/0083506 | A1 | 4/2013 | Wright et al. |
| 2014/0124822 | A1 | 5/2014 | Fan |
| 2014/0218867 | A1 | 8/2014 | Kim et al. |
| 2015/0118482 | A1 | 4/2015 | Kagawa |
| 2015/0303535 | A1 | 10/2015 | White et al. |
| 2016/0076829 | A1 | 3/2016 | Lee et al. |
| 2016/0153730 | A1 | 6/2016 | Park |

FOREIGN PATENT DOCUMENTS

| | | |
|---|---|---|
| CN | 105517406 A | 4/2016 |
| DE | 19909998 | 9/2000 |
| GB | 1326803 | 8/1973 |
| JP | 2014127518 A | 7/2014 |
| JP | 2015001261 | 1/2015 |
| WO | 2015084268 A1 | 6/2015 |

* cited by examiner

MULTILAYER HOUSINGS

BACKGROUND

Electronic devices may include a housing. Various components such as a hardware processor, graphics processing unit, etc. of the electronic devices may be disposed within a cavity and/or volume defined by the housing. Components disposed within the housing of the electronic device may produce heat during operation of the electronic device.

DETAILED DESCRIPTION

Electronic devices such as smartphones, handheld computers, personal digital assistants, carputers, wearable computers, laptops, tablet computers, laptop/tablet hybrids, etc., may include a housing. As mentioned, various components such as a hardware processor, graphics processing unit, etc. of the electronic devices may be disposed within a cavity and/or volume defined by the housing. The components disposed within the housing of the electronic device may produce heat during operation of the electronic device. As such, it may be desirable to transfer heat from the interior of the housing to the environment exterior to the housing to ensure the electronic device functions as intended and remains within a designed operating temperature envelope. However, such transfer of heat must also avoid exposure of an end user of the electronic device to elevated temperatures as this may be undesirable.

Accordingly, the disclosure is directed to multilayer housings, electronic devices including multilayer housings, and methods of manufacture of multilayer housings. For example, multilayer housings as described herein can include a first continuous layer comprising copper, plastic, graphene, aluminum, titanium, magnesium, or combinations thereof, a void layer on the first continuous layer, where the void layer comprises from 5 volume percent (vol. %) to 95 vol. % voids, and a second continuous layer on the void layer, where the second continuous layer comprises copper, plastic, graphene, aluminum, titanium, magnesium, or combinations thereof.

Desirably, multilayer housings as described herein transfer heat from an electronic device to an environment surrounding the electronic device, yet maintain a desired operational temperature from the perspective of an end user due at least in part the presence of a void layer. Thus, multilayer housings desirably migrate heat transfer from an interior of the housing to an exterior of the housing, in contrast to other approaches that may employ housing formed of a unitary heat conductive material such as a metal and/or may be formed of successive layers of heat conductive materials (e.g., a heat tape) that may not mitigate heat transfer which may lack a void layer and may have an undesirably high operating temperature experienced by an end user of an electronic device.

Figure 1:
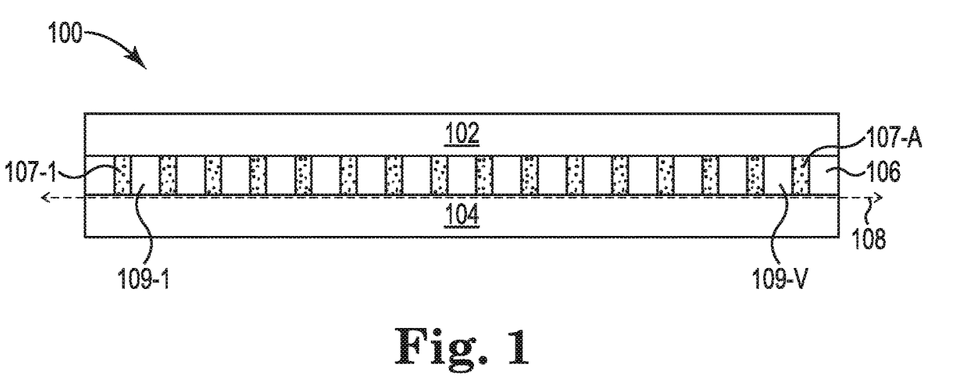
FIG. 1 illustrates a diagram of an example of a multilayer housing according to the disclosure.

FIG. 1 illustrates a diagram of an example of a multilayer housing 100 according to the disclosure. As illustrated in FIG. 1, the multilayer housing can include a first continuous layer 104, a second continuous layer 102, and a void layer 106. However, the disclosure is not so limited. Rather, multilayer housings can include additional or less layers depending, for example, upon a desired application of the multilayer housings, among other considerations. For instance, in some examples, the multilayer housing 100 can include an adhesive layer (not shown).

As used herein, a continuous material refers to a material that is substantially unbroken or without interruption. For example, it is noted that the first continuous layer 104 and the second continuous layer 102 in various examples are void-free or substantially void-free. Stated differently, in various examples the first continuous layer 104 and the second continuous layer 102 are at least substantially void-free (i.e., substantially without voids such as the voids included in the void layer 106).

The first continuous layer 104 and/or the second continuous layer 102 can each independently be formed of copper, plastic, graphene, aluminum, titanium, magnesium, or combinations thereof, among other suitable continuous conductive materials. For instance, in some examples, the first continuous layer 104 and/or the second continuous layer 102 can be formed of copper. For example, the first continuous layer 104 and/or the second continuous layer 102 can be formed essentially of copper, in some examples. However, as mentioned the disclosure is not so limited.

The first continuous layer 104 and the second continuous layer 102 can each be formed of plastic, in some examples. In some examples, the first continuous layer 104 or the second continuous layer 102 can be formed of copper while the other of the first continuous layer 104 or the second continuous layer 102 can be formed of plastic, among various other possibilities to promote multilayer housings.

The void layer 106 refers to a layer having from 5 to 95 vol. % voids 109-1, . . . 109-V and from 95 to 5 vol. % solid material. Voids 109-1, . . . , 109-V refer volumes within and/or between a material 107-1, . . . 107-A of the void layer 106. The voids can therefore contain or otherwise permit flow of a gas such as air. Thus, the void layer 106 can again be formed of a combination of solid portions of the material 107-1, . . . 107-A (95 to 5 vol. % solid material) that is interspersed with the voids 109-1, . . . , 109-V (5 to 95 vol. % voids).

In some examples, the void layer 106 can be formed of patterned adhesive and have from 5 to 95 vol. % voids between the patterned adhesive forming the void layer 106. The patterned adhesive can be formed of an isocyanate based polymer, epoxy, acrylic, hot melt adhesive, an ethylene-vinyl acetate (EVA) copolymer, a polyamide, a polyolefin, styrene copolymer, polyester, polyurethane, a rubber-based adhesive, or combinations thereof, among other types of suitable adhesives to promote multilayer housings.

In some examples, the patterned adhesive of the void layer 106 can include an additive such as a thermally conductive additive, among other types of additives. Examples of thermally conductive additives include graphene, carbon nanotubes, graphite, aluminum, copper, silver, silicon, gold, diamond, or combinations thereof. Other additives such as colorants, binders, and/or adhesion agents can be included in the void layer 106.

As mentioned, the multilayer housing 100 can be employed with a variety of electronic devices. For example, when used in the manufacture of a laptop housing, the multilayer housing 100 may have a thickness on the order of a few millimeters (mm). For example, the multilayer housing 100 can have a thickness between 0.5-12 mm (a combined thickness of the first continuous layer 104, the second continuous layer 102, the void layer 106, etc.), among other possibilities. For instance, in some examples, the multilayer housing can form a housing of a laptop, a tablet, a mobile phone, or combinations thereof, and have a thickness of from 0.03 millimeters to 2.0 millimeters. Further, it is understood that all values and subranges are included within respective ranges provided in this disclosure.

The first continuous layer 104 and the second continuous layer 102 can independently have a thickness (in a direction orthogonal to a plane along cross-section 108) from 10 µm to 150 µm. In some examples, the void layer can have a thickness (in a direction orthogonal to cross-section 108) from 20 microns to 40 microns. Again, it is noted that all individual values and subranges within a range are included.

The patterned adhesive of the void layer 106 can desirably couple the first continuous layer 104 to the second continuous layer 104. For instance, the void layer can directly couple (as illustrated in FIG. 1 without intervening layers) or can indirectly couple (with intervening layer such as a graphene coat layer described herein) the first continuous layer 104 to the second continuous layer 106.

While the void layer 106 can be formed of patterned adhesive the disclosure is not so limited. For instance, in some examples, the void layer 106 can be formed of fiberglass, mineral wools, cellulose, calcium silicate, cellular glass, elastomeric foam, phenolic foam, vermiculite, polyurethane foam, polystyrene foam in polymeric resins such as thermoplastic and/or thermoset resins, among other types of materials having from 5 to 95 vol. % voids.

Figure 2:
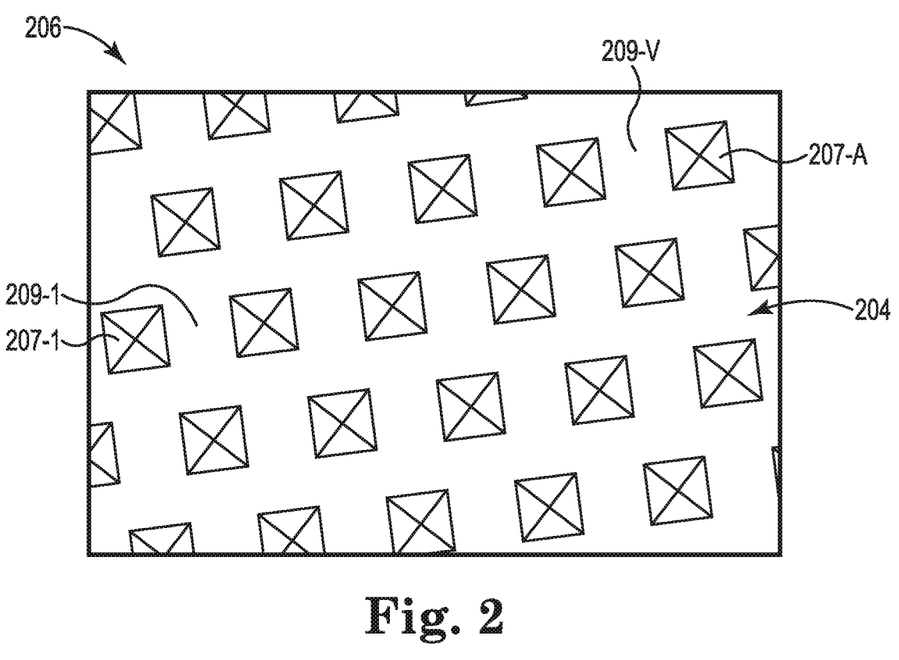
FIG. 2 illustrates a cross-section of an example of a void layer included in an example of multilayer housing according to the disclosure.

FIG. 2 illustrates a cross-section of an example of a void layer 206 included in an example of multilayer housing according to the disclosure. As illustrated in FIG. 2 (taken along cross-section 108 of FIG. 1), void layer 206 can include a patterned adhesive disposed on the first continuous layer 204 in the form of separate and distinct adhesive dots 207-1, . . . , 207-A having voids 209-1, . . . 209-V interspersed between the patterned adhesive dots. That is, the adhesive dots 207-1, . . . , 207-A are themselves formed of solid adhesive dots with voids 209-1, . . . , 209-V interspersed between the patterned adhesive dots.

That is, the patterned adhesive can be formed of patterned adhesive dots and/or patterned ribbons of adhesive, among other possibilities. As used herein, adhesive dots refer to round, circular, or other shaped depositions of adhesive that are substantially separate and distinct from each other. Put another way, the adhesive dots can be positioned on a layer (e.g., the first continuous layer 104) so respective dots of the adhesive dots (or at least the majority thereof) do not physically contact each other. In this manner, voids 209-1, . . . , 209-V can be formed between each of the respective adhesive dots 207-1, . . . , 207-A. The shape, size, and total number of the voids 209-1, . . . , 209-V can vary depending upon a shape, size, and total number of the adhesive dots 207-1, . . . , 207-A.

While FIG. 2 illustrates a certain pattern, number and shape of adhesive dots it is understood that the adhesive pattern, a shape of the adhesive dots, a total number of adhesive dots, the relative location of adhesive dots, and/or a size of the adhesive dots, among other items, can vary to promote aspects of multilayer housings described herein.

Figure 3:
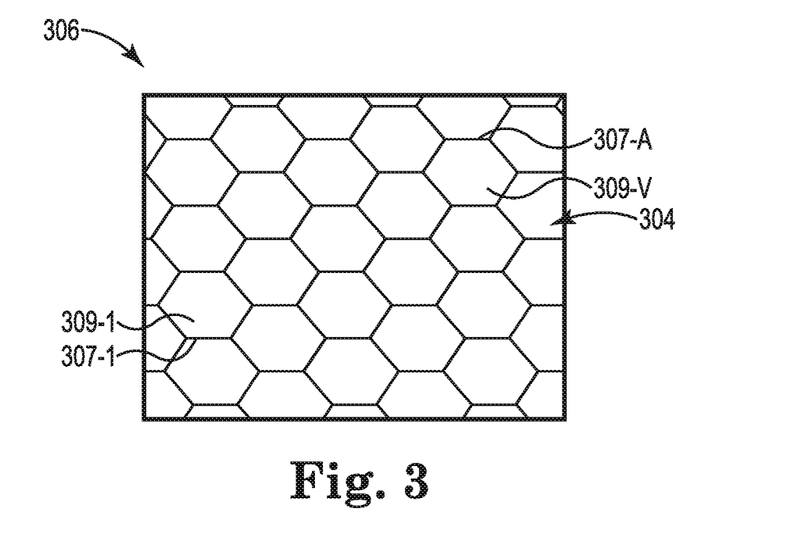
FIG. 3 illustrates a cross-section of an example of a void layer included in an example of multilayer housing according to the disclosure.

FIG. 3 illustrates a cross-section of an example of a void layer 306 included in an example of multilayer housing according to the disclosure. As illustrated in FIG. 3 (taken along cross-section 108 of FIG. 1) the void layer 306 can include a patterned adhesive disposed on a layer (e.g., on the first continuous layer 304) in the form of patterned adhesive ribbons 307-1, . . . , 307-A having voids 309-1, . . . 309-V interspersed between the patterned adhesive ribbons. While FIG. 3 illustrates a certain pattern, number and shape of adhesive ribbons it is understood that the adhesive pattern, a shape of the adhesive ribbons, a total number of adhesive ribbons, the relative location of adhesive ribbons, and/or a size of the adhesive ribbons, among other items, can vary to promote aspects of multilayer housings described herein.

Figure 4:
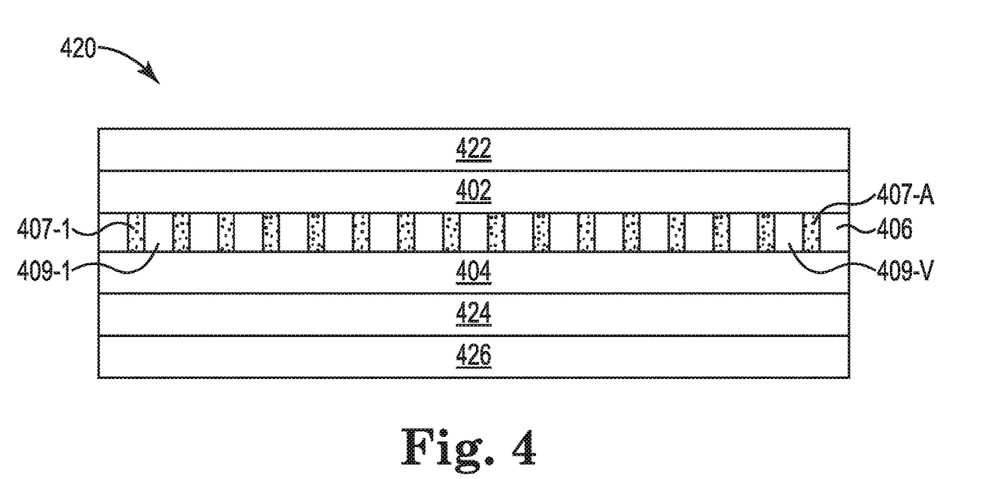
FIG. 4 illustrates a diagram of another example of a multilayer housing according to the disclosure.

FIG. 4 illustrates a diagram of another example of a multilayer housing 420 according to the disclosure. As illustrated in FIG. 4 the multilayer housing 420 can include a first continuous layer 404, a second continuous layer 402, a void layer 406, a first graphene coat layer 424, a second graphene coat layer 422, and an adhesive layer 426.

The first continuous layer 404 can be analogous to the first continuous layer 104, the first continuous layer 204, the first continuous layer 304, the first continuous layer 504, and/or the third continuous layer 546, illustrated in FIGS. 1, 2, 3, and 5. The second continuous layer 202 can be analogous to the second continuous layer 102, the second continuous layer 402, and/or the second continuous layer 502 described with respect to FIGS. 1, 4, and 5, respectively.

The void layer 406 can be analogous to the void layer 106, the void layer 206, the void layer 306, the void layer 506, and/or the void layer 542, illustrated with respect to FIGS. 1, 2, 3, and 5. For instance, as illustrated in FIG. 4, the void layer can include a material 407-1, . . . , 407-A and voids 409-1, . . . 409-V interspersed between the material.

The first graphene coat layer 424 and the second graphene coat layer 422 can be individually be from 10 to 150 nanometers (nm) thick. The first graphene coat layer 424 and the second graphene coat layer 422 can be formed by various chemical processes and/or by graphene disposition techniques such as by physical vapor deposition (PVD). The first graphene coat layer 424 and the second graphene coat layer 422 can be analogous to the third graphene coat layer 544 and the fourth graphene coat layer 548 described herein with respect to FIG. 5.

The adhesive layer 426 can include isocyanate based polymers (PMDI, urethanes, urea), epoxies, acrylics, hot melt adhesives, ethylene-vinyl acetate (EVA) copolymers, polyamides, polyolefins, styrene copolymers, polyester, polyurethane, rubber-based adhesives, or combinations thereof. The adhesive layer can be analogous to adhesive layer 526 as illustrated in FIG. 5.

Figure 5:
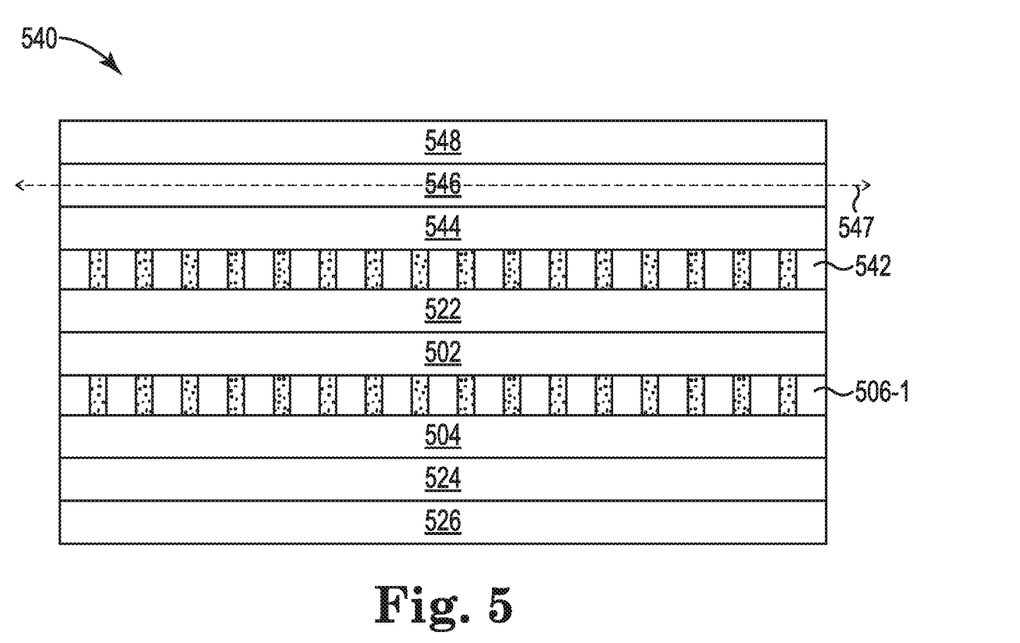
FIG. 5 illustrates a diagram of yet another example of a multilayer housing according to the disclosure.

FIG. 5 illustrates a diagram of yet another example of a multilayer housing according to the disclosure. As illustrated in FIG. 5, the multilayer housing 540 can include a first continuous layer 504, a second continuous layer 502, a void layer 506, a first graphene coat layer 524, a second graphene coat layer 522, an adhesive layer 526, a second void layer 542, a third graphene coat layer 544, a third continuous layer 546, and a fourth graphene coat layer 548.

As illustrated in FIG. 5, multilayer housings can include a plurality of void layers, in some examples. Similarly, a total number of the continuous layers and/or a total number of the graphene coat layers in multilayer housings can be varied depending upon a desired application and/or heat transfer capability of a multilayer housing.

Figure 6:
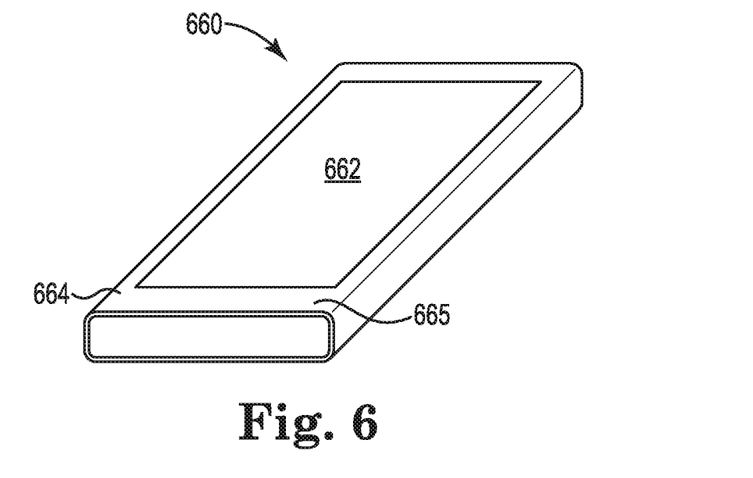
FIG. 6 illustrates a diagram of an example of an electronic device according to the disclosure.

FIG. 6 illustrates a diagram of an example of an electronic device 660 according to the disclosure. As illustrated in FIG. 6, the electronic device 660 has a multilayer housing 664. The multilayer housing 664 can be analogous to the multilayer housing 100, 420, and/or 540 as described herein with respect to FIGS. 100, 420, 540.

The electronic device can include various heat-producing components such as a hardware processor, a graphics processing unit, and/or a memory resource, among others. The multilayer housing 664 can form a cavity and/or a volume including at least the heat-producing components. As mentioned, the multilayer housing 664 can desirably transfer heat from the heat-producing components to an environment around the electronic device 660 though conduction of the heat via the multilayer housing 664. As such and in contrast to some electronic device, the electronic device 660 can, in some examples, be a fan less electronic device (i.e., an electronic device without a fan).

The electronic device 660 can include a display 662. The display 662 can be formed of various substrate materials such as a polyacrylics film, a polycarbonate, a Cyclic Olefin Copolymer (COC) film, a polyimide film, a polyethylene terephthalate (PET) film and/or composite plastic film, among other possibilities.

In some examples, the display can include graphene on the substrate material. For instance, the substrate materials can include a graphene layer disposed on a front surface 665 or back surface opposite the front surface of the display. In some examples, the electronic device 660 can include multi-graphene layers. For instance, a respective graphene layer can be disposed on each of the front surface 665 and the back surface of the electronic device 660. The multi-graphene layers can each independently have a thickness of from 10 to 150 nm. The multi-graphene layers can each have an electrical conductivity of approximately from $5 \times 10^7$ to approximately $2 \times 10^9$ Siemens per meter (S/m).

The multi-graphene layers can, in some examples, by deposited simultaneously on the substrate material by a physical vapor deposition roll-to-roll process, among other possibilities. In some examples, a graphene layer of the multi-graphene layers can be etched, for example, by a laser to form an electrode pattern suitable to render the display 662 suitable as a touch screen display. For instance, the 662 can in some examples be a flexible touch display.

In some examples the display substrate can be separated into two portions. That is, the display substrate can be split along a length (along a plane in the same direction as a plane along the cross-section 108 illustrated in FIG. 1). For instance, in some examples a display substrate can be coated with a multi-graphene layers and subsequently separated to produce two display substrates each with a respective graphene layer. The two display substrates can each be etched to form electrode patterns suitable to render each of the two displays suitable as a touch screen displays when adhered to a transparent material via an adhesive layer. The economics and use of a substrate that can be split into two displays which can be formed into touch screen can be desirable.

The electronic device 660 can include various components (not shown) such as buttons, keyboards, speakers, cameras, ports or additional screens. For example, the electronic device 662 can be a smartphone, media player, tablet computer, laptop computer, notebook computer, and/or other types of portable device.

Figure 7:
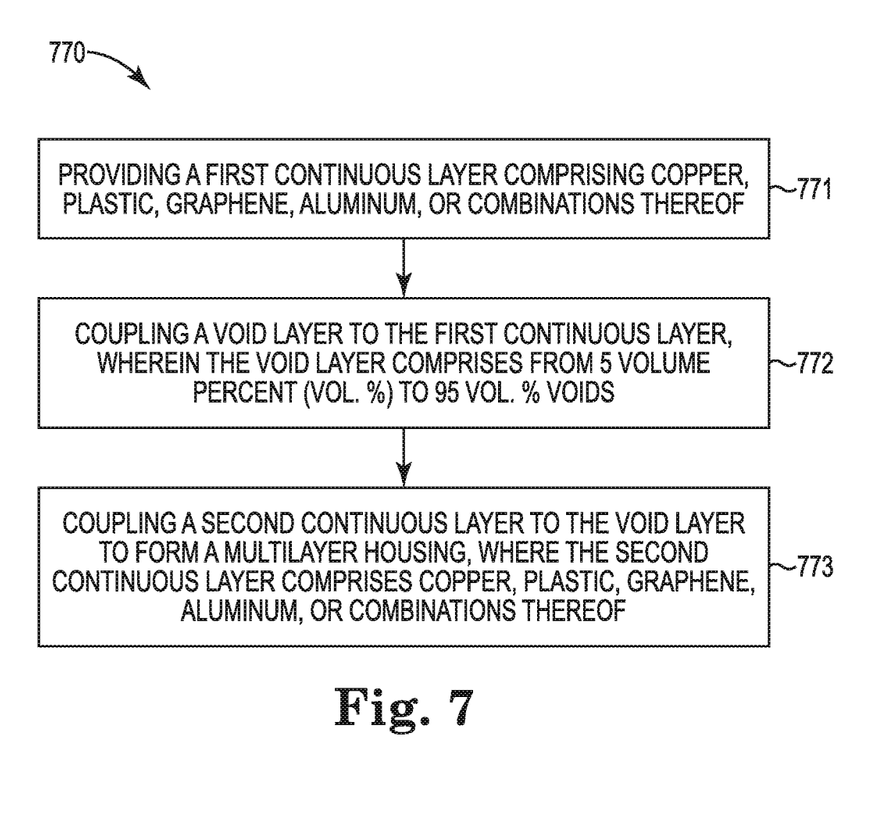
FIG. 7 illustrates a flow diagram of an example of a method of manufacture of a multilayer housing according to the disclosure.

FIG. 7 illustrates a flow diagram of an example of a method 770 of manufacture of a multilayer housing according to the disclosure. As illustrated at 771, the method 770 can include providing a first continuous layer comprising copper, plastic, graphene, aluminum, titanium, magnesium, or combinations thereof. As used herein, providing can include manufacture of and/or otherwise procuring the first continuous layer.

The method 770 can include coupling a void layer to the first continuous layer, where the void layer comprises from 5 vol. % to 95 vol. % voids, as illustrated at 772. As illustrated at 773, the method 770 can include coupling a second continuous layer to the void layer to form a multilayer housing, where the second continuous layer comprises copper, plastic, graphene, aluminum, titanium, magnesium, or combinations thereof.

In some examples, the method 770 can include directly coupling (without intervening elements) the void layer to the first continuous layer. Similarly, in some examples the method 770 can include directly coupling the void layer to the first continuous layer.

While the above Figures are directed primarily to multilayer housings the disclosure is not so limited. FIGS. 8A, 8B, 8C, 8D, and 8E illustrate an example of a method of manufacture of a patterned graphene electrode 880 according to the disclosure. The patterned graphene electrode can be included in a multilayer housing, in some examples, as a display and/or touch screen disposed within the multilayer housing.

Figure 8A:
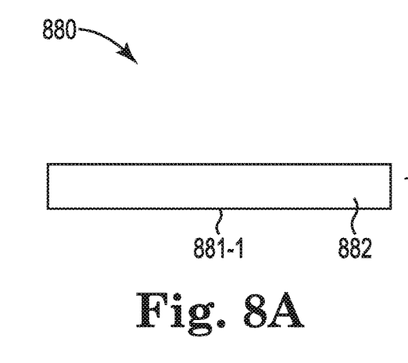
FIGS. 8A, 8B, 8C, 8D, and 8E illustrate an example of a method of manufacture of a patterned graphene electrode according to the disclosure.

As illustrated in FIG. 8A at 881, the method 880 of forming the patterned graphene electrode can include providing a substrate 882. The substrate 882 can be formed of various substrate materials such as a polyacrylics film, a polycarbonate, a cyclic olefin copolymer (COC) film, a polyimide film, a polyethylene terephthalate (PET) film and/or composite plastic film, among other possibilities.

In some examples, the method 880 can include providing a flexible substrate 882 such as those suitable as a flexible touch screen or suitable to form the basis of a flexible touch screen when subjected to further processing steps such as formation of electrodes on or in the substrate 880. Examples, of suitable flexible materials include various flexible substrate materials such as a polyacrylics film, a polycarbonate, a cyclic olefin copolymer (COC) film, a polyimide film, a polyethylene terephthalate (PET) film and/or composite plastic film, among other possibilities. It is noted the substrate 882 (flexible or otherwise) can be substantially transparent so as to be suitable for use a display screen and/or a touch screen.

Figure 8B:
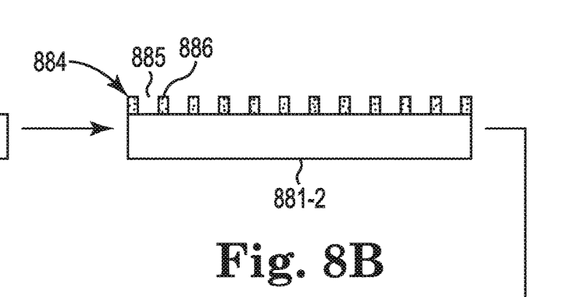
Figures 8C, 8D:
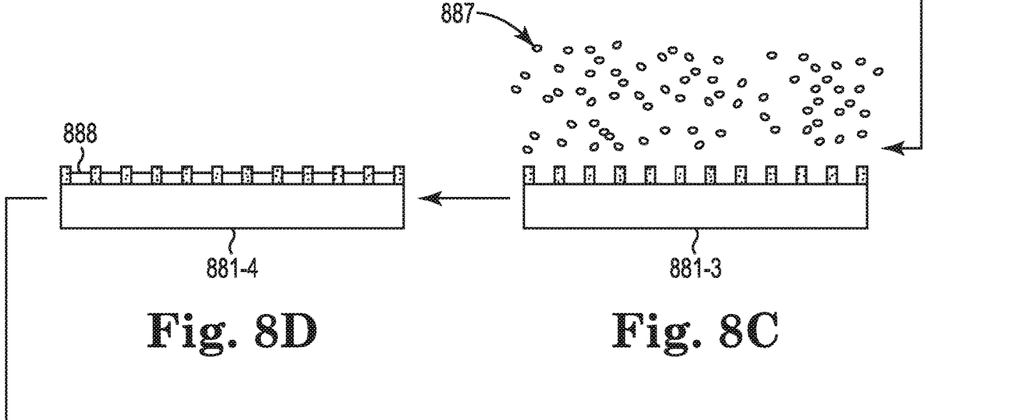

As illustrated at 881-2 in FIG. 8B, the method can include coupling a detachable patterned film 884 to the substrate 882 (provided at 881-1). Examples of detachable patterned films include polyester, silicone rubber and/or thermal resistant thermoplastic polymers. In any case, it is noted the detachable patterned film 884 has openings 882 therein to permit deposition of graphene 887 (via ion-beam sputtering (IBS), reactive sputtering, ion-assisted deposition (IAD), high-target-utilization sputtering, high-power impulse magnetron sputtering (HIPIMS), gas flow sputtering and/or chemical vapor deposition, among other possibilities) of the substrate 882, as shown in FIG. 8C at 881-3. Notably, material 886 of the film 884 covers other portions of the substrate 882 and thereby prohibits deposition on the other covered portions. In this manner, electrodes can be selectively formed on and/or in various locations of the substrate 882 such that the substrate 882 includes a graphene layer 888, as illustrated at 881-4.

Figure 8E:
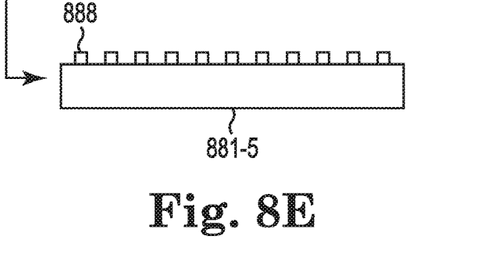

The method 880 can include removal of the detachable patterned film 884, as illustrated in FIG. 8E at 881-5. That is, as once the detachable film 884 is removed and the resulting structure becomes a patterned graphene electrode suitable for use as a display and/or a touch screen once the detachable patterned film is removed. Removal can include mechanical and/or chemical removal of the detachable patterned film. For instance, the detachable patterned film 884 can be 'peeled' or otherwise mechanically removed from the substrate 882. The resulting patterned graphene electrode can have a desirable conductivity as compared to other structures including electrodes that are prepared with different techniques.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure.

The figures herein follow a numbering convention in which the first digit corresponds to the drawing figure number and the remaining digits identify an element or component in the drawing. For example, reference numeral 106 may refer to element "10" in FIG. 1 and an analogous element may be identified by reference numeral 206 in FIG. 2. Elements shown in the various figures herein can be added, exchanged, and/or eliminated so as to provide a number of additional examples of the disclosure. In addition, the proportion and the relative scale of the elements provided in the figures are intended to illustrate the examples of the disclosure, and should not be taken in a limiting sense.

As used herein, "a number of" an element and/or feature can refer to one or more of such elements and/or features. It is understood that when an element is referred to as being "on," "connected to", "coupled to", or "coupled with" another element, it can be directly on, connected to, or coupled with the other element or intervening elements may be present. As used herein, "substantially" refers to a characteristic that is close enough to the absolute characteristic to achieve the same functionality.

What is claimed:

1. A multilayer housing, comprising:
  a first continuous layer comprising copper, plastic, graphene, aluminum, titanium, magnesium, or combinations thereof;
  a void layer on the first continuous layer, wherein the void layer comprises: i) patterned adhesive; or ii) fiberglass, mineral wools, cellulose, calcium silicate, cellular glass, elastomeric foam, phenolic foam, vermiculite, polyurethane foam, polystyrene foam in polymeric resins, and wherein the void layer comprises from 5 volume percent (vol. %) to 95 vol. % voids between i) or ii); and
  a second continuous layer on the void layer, wherein the second continuous layer comprises copper, plastic, graphene, aluminum, titanium, magnesium, or combinations thereof.

2. The multilayer housing of claim 1, wherein the void layer comprises patterned adhesive having the 5 to 95 vol. % voids between the patterned adhesive.

3. The multilayer housing of claim 2, wherein the patterned adhesive comprises an isocyanate based polymer, epoxy, acrylic, hot melt adhesive, an ethylene-vinyl acetate (EVA) copolymer, a polyamide, a polyolefin, styrene copolymer, polyester, polyurethane, a rubber-based adhesive, or combinations thereof.

4. The multilayer housing of claim 3, wherein the patterned adhesive further comprises a thermally conductive additive selected from graphene, carbon nanotubes, graphite, aluminum, copper, silver, silicon, gold, diamond, or combinations thereof.

5. The multilayer housing of claim 1, wherein the first continuous layer, the second continuous layer, or a combination thereof consist essentially of copper.

6. The multilayer housing of claim 1, wherein the void layer is comprised of fiberglass, mineral wools, cellulose, calcium silicate, cellular glass, elastomeric foam, phenolic foam, vermiculite, polyurethane foam, polystyrene foam in polymeric resins.

7. The multilayer housing of claim 1, wherein the void layer has a thickness from 20 microns to 40 microns.

8. The multilayer housing of claim 1, wherein the first continuous layer and the second continuous layer are each substantially void-free.

9. The multilayer housing of claim 1, further comprising an adhesive layer coupled to the second continuous layer or a graphene coat layer coupled to the second continuous layer.

10. An electronic device, comprising:
  a hardware processor;
  a memory resource: and
  a multilayer housing forming a cavity in which the hardware processor and the memory resource are disposed, the multilayer housing comprising:
  a first continuous layer comprising copper, plastic, graphene, aluminum, titanium, magnesium, or combinations thereof;
  a void layer comprised of patterned adhesive on the first layer, wherein the void layer comprises from 5 volume percent (vol. %) to 95 vol. % voids between the patterned adhesive; and
  a second continuous layer coupled by the patterned adhesive of the void layer to the first continuous layer, wherein the second continuous layer comprises copper, plastic, graphene, aluminum, titanium, magnesium, or combinations thereof.

11. The electronic device of claim 10, wherein the electronic device further comprises a fan less electronic device.

12. The electronic device of claim 11, wherein the electronic device further comprises a laptop, a tablet, a mobile phone, or combinations thereof.

13. The electronic device of claim 10, wherein a total thickness of the multilayer housing of the electronic device is from 0.03 millimeters (mm) to 2.0 millimeters.

14. A method of manufacture of a multilayer housing, the method comprising:
  providing a first continuous layer comprising copper, plastic, graphene, aluminum, titanium, magnesium, or combinations thereof;
  coupling a void layer to the first continuous layer, wherein the void layer comprises: i) patterned adhesive; or ii) fiberglass, mineral wools, cellulose, calcium silicate, cellular glass, elastomeric foam, phenolic foam, vermiculite, polyurethane foam, polystyrene foam in polymeric resins, and wherein the void layer comprises from 5 volume percent (vol. %) to 95 vol. % voids between i) or ii); and coupling a second continuous layer to the void layer to form a multilayer housing, wherein the second continuous layer comprises copper, plastic, graphene, aluminum, titanium, magnesium, or combinations thereof.

15. The method of claim 14, further comprising directly coupling the void layer to the first continuous layer and directly coupling the void layer to the second continuous layer.

\* \* \* \* \*